United States Patent [19]

Somerville

[11] Patent Number: 4,887,047
[45] Date of Patent: Dec. 12, 1989

[54] CURRENT SENSE AMPLIFIER WITH LOW, NONLINEAR INPUT IMPEDANCE AND HIGH DEGREE OF SIGNAL AMPLIFICATION LINEARITY

[75] Inventor: Thomas A. Somerville, Tucson, Ariz.
[73] Assignee: Burr-Brown Corporation, Tucson, Ariz.
[21] Appl. No.: 252,394
[22] Filed: Sep. 30, 1988
[51] Int. Cl.[4] .............................................. H03F 3/45
[52] U.S. Cl. .................................... 330/257; 330/253
[58] Field of Search ............... 330/257, 258, 311, 151, 330/253

[56] References Cited

U.S. PATENT DOCUMENTS

| | | | |
|---|---|---|---|
| 3,760,194 | 9/1973 | Lutz et al. | 307/235 R |
| 3,805,093 | 4/1974 | Hodemaekers | 307/235 R |
| 3,848,139 | 11/1974 | Holt, Jr. | 307/235 R |
| 3,931,583 | 1/1976 | Gilbert | 330/38 M |
| 4,163,950 | 8/1979 | Damm et al. | 330/252 |
| 4,390,848 | 6/1983 | Blauschild | 330/151 |
| 4,456,887 | 6/1984 | Tokumo | 330/261 |
| 4,528,517 | 7/1985 | Schlotzhauer | 330/151 X |
| 4,553,107 | 11/1985 | Ogawa | 330/288 |

*Primary Examiner*—James B. Mullins
*Attorney, Agent, or Firm*—Cahill, Sutton & Thomas

[57] ABSTRACT

A current sense amplifier includes first and second current mirrors cross-coupled to collectors of first and second transistors having a common base connection to a bias voltage circuit. First and second load devices are connected to the collectors of the first and second transistors, the emitters of which are connected to control transistors of the second and first current mirrors, respectively. The control transistors also receive first and second input currents, respectively. The collectors of the first and second transistors are connected to output terminals of the current sense amplifier.

13 Claims, 2 Drawing Sheets

CURRENT SENSE AMPLIFIER WITH LOW, NONLINEAR INPUT IMPEDANCE AND HIGH DEGREE OF SIGNAL AMPLIFICATION LINEARITY

BACKGROUND OF THE INVENTION

A wide variety of isolation amplifiers and other isolation circuits are widely used in which input circuitry on one side of an isolation barrier such as an isolation transformer, optical coupler, or pair of isolation capacitors have essentially no DC coupling to terminals of output circuitry coupled to the other side of the isolation barrier. Such circuits find widespread use in medical monitoring equipment and various other applications, including remote temperature sensing industrial process control circuits, in which it is essential that transient voltage disturbances (especially common mode transient voltage disturbances) on one side of the isolation barrier do not produce corresponding transient voltage disturbances in the output circuitry. Such transient voltage disturbances typically are produced by DC-to-DC converter circuits or power supply circuits utilized to independently provide decoupled power supply voltages to the input circuitry and output circuitry. Transient voltage disturbances also can be produced by line voltage transients coupled through isolation transformer winding capacitances from the input to the output side of the isolation barrier. In some equipment, such as medical monitoring equipment, transient voltage disturbances produced from sources such as electro-surgery units may have slew rates of up to 10,000 volts per microsecond. Such instruments may produce radio frequency energy of up to 1000 volts RMS at a frequency of one megahertz. In some of the present assignee's recently introduced isolation amplifiers which utilize a pair of 1 picofarad capacitors as an isolation barrier, peak common mode transient currents of 10 milliamperes may flow through the 1 picofarad isolation capacitors and into the inputs of the sense amplifier stage of the output circuitry. Not only should the circuitry reliably conduct these currents, but it should also continue to communicate accurate signal information (for example, information representing an electrocardiogram waveform).

Some prior sense amplifier circuits are capable of operating in the presence of fairly large common mode transient input voltages that increase by as much as 1000 volts per microsecond.

There is a need for an improved current sense amplifier capable of achieving highly linear performance despite the presence of large, rapidly changing common mode input currents.

SUMMARY OF THE INVENTION

Accordingly, it is an object of the invention to provide an improved current sense amplifier which provides a high degree of linearity despite the presence of large common mode input current signals.

It is another object of the invention to provide a current sense amplifier having high linearity, good common mode rejection, and the ability to absorb large common mode input currents without damage.

Briefly described, and in accordance with one embodiment thereof, the invention provides a current sense amplifier including first, second, third, and fourth transistors. The collectors of the first and second tranistors are connected to first and second output terminals, respectively, of the current sense amplifier. First and second load resistors are coupled between a supply voltage conductor and first and second output terminals, respectively, of the current sense amplifier. The emitter of the first transistor is connected to a control input of a first current mirror having an output connected to the second output terminal. The control input of the first current mirror also is connected to a first input terminal of the current sense amplifier. The third transistor functions as an output transistor of the first current mirror, and has its collector connected to the second output terminal and its base connected to the first input terminal. The emitter of the second transistor is connected to a control input of a second current mirror. The fourth transistor functions as an output transistor of the second current mirror and has its collector connected to the first output terminal. The fourth transistor has its base connected to the second input terminal. First and second diode-connected transistors function as control transistors of the first and second current mirrors, respectively. The described current sense amplifier provides linear amplification in its differential amplification mode and provides a fairly good common mode rejection ratio, especially for low common mode input currents. The circuit also provides low input impedance and high bandwidth. In an alternate embodiment of the invention, the transistors are field effect transistors rather than bipolar transistors.

BRIEF DESCRIPTION OF THE DRAWINGS

FIG. 5 is a graph of common mode rejection ratio of the circuit of FIG. 1 versus the ratio of $\Delta I_{IN1}$ to $I_0$.

DETAILED DESCRIPTION OF THE PREFERRED EMBODIMENT

Figure 1:
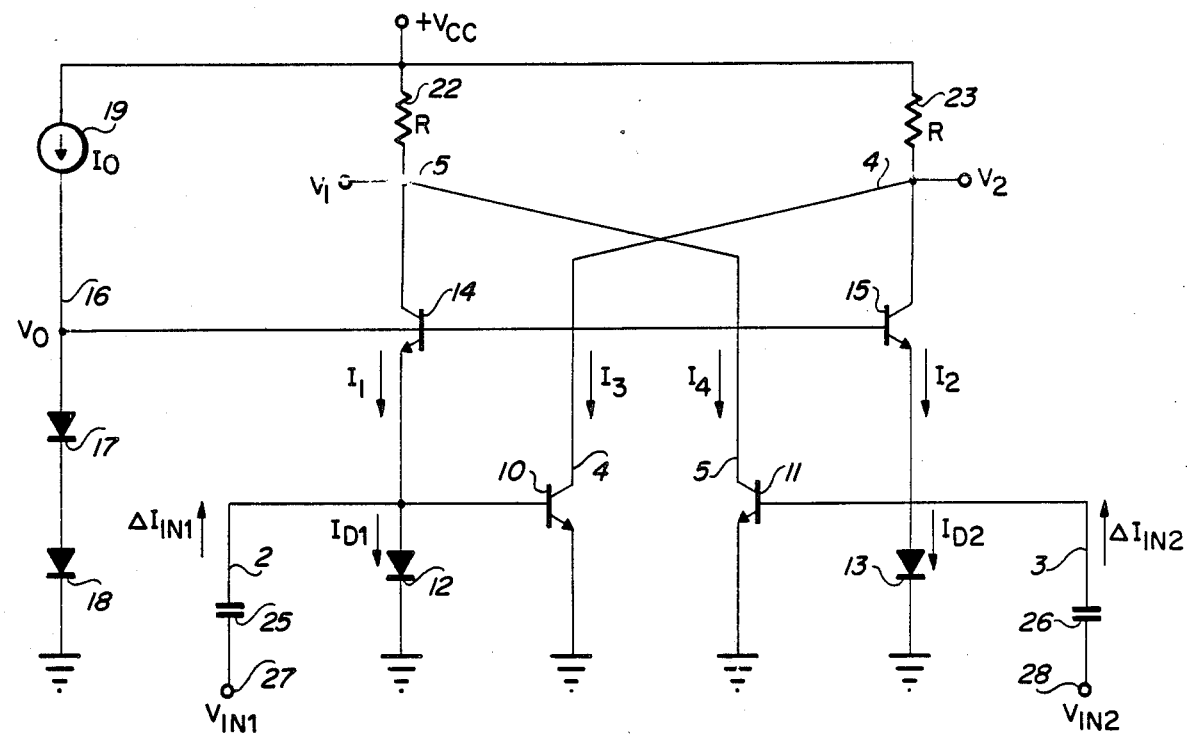
FIG. 1 is a schematic circuit diagram of an embodiment of the present invention.

Referring to FIG. 1, the current sense amplifier 1 includes an input conductor 2 connected to the anode of a diode 12, the base of NPN transistor 10, and the emitter of NPN transistor 14. Diode 12 is a diode connected NPN transistor. The cathode of diode 12 is connected to ground. The emitter of transistor 10 is connected to ground, and its collector is connected by conductor 4 to the collector of NPN transistor 15 and to one terminal of a resistor 23, the other terminal of which is connected to $V_{CC}$.

The base of transistor 14 is connected by conductor 16 to the base of transistor 15 and to one terminal of a current source 19, the other terminal of which is connected to $V_{CC}$. Conductor 16 also is connected to the anode of diode 17, the cathode of which is connected to the anode of diode 18. The cathode of diode 18 is connected to ground.

The collector of transistor 14 is connected by conductor 5 to one terminal of resistor 22, the other terminal of which is connected to $V_{CC}$. Conductor 5 also is connected to the collector of NPN transistor 11, the emitter of which is connected to ground.

The emitter of transistor 15 is connected to input conductor 3. Input conductor 3 also is connected to the base of transistor 11 and to the anode of diode 13, the cathode of which is connected to ground. Diode 13 is a diode-connected NPN transistor, as are diodes 17 and 18.

Typically, input terminals 2 and 3 will be connected to one terminal of each of isolation capacitors 25 and 26, respectively. The other terminal of capacitor 25 is connected to conductor 27. Another terminal of isolation capacitor 26 is connected to terminal 28. A current $\Delta I_{IN1}$ flows through isolation barrier capacitor 25 into input conductor 2. Similarly, $\Delta I_{IN2}$ flows from terminal 28 through isolation barrier capacitor 3 into input conductor 3.

If the current sense amplifier 1 is used in an isolation amplifier, common mode voltages on conductors 27 and 28 may increase or decrease by as much as ten kilovolts or more per microsecond. If this occurs, common mode values of $\Delta I_{IN1}$ and $\Delta I_{IN2}$ as high as ten milliamperes may occur for the duration of the common mode transient voltage.

The operation of the current sense amplifier of FIG. 1 has been simulated on a computer. It has been found to provide highly linear small signal performance in response to differential input signals (equal to the difference between $\Delta I_{IN1}$ and $\Delta I_{IN2}$), even during large common mode input currents of up to ten milliamperes, and also providing a good level of common mode rejection, all while operating on a "single rail" power supply voltage of $V_{CC}$ equal to +5 volts.

To understand the operation of the current sense amplifier of FIG. 1, it will be helpful to consider the "small signal" or AC operation first. To understand the small signal operation, assume that the common mode input current in conductors 2 and 3 is zero. $\Delta I_{IN1}$ is split between diode 12 and transistor 14. The base current of transistor 10 is negligibly small. For convenience, it will be assumed that a one milliampere current $I_0$ flows through constant current source 19 and diodes 17 and 18. Then the impedance at node 16 is approximately 52 ohms, since the forward resistance of each of diodes 17 and 18 is $(kT)/qI_0$, which is 26 ohms. For convenience, it also will be assumed that the current flowing through transistor 14 and diode 12 is 0.5 milliamperes, so that the emitter resistance of transistor 14 is 52 ohms and the resistance of diode 12 is 52 ohms. It will be assumed that resistors 22 and 23 each have a resistance of 300 ohms. Also assume that 0.5 milliamperes flows through transistor 15 and diode 13.

Figure 2:
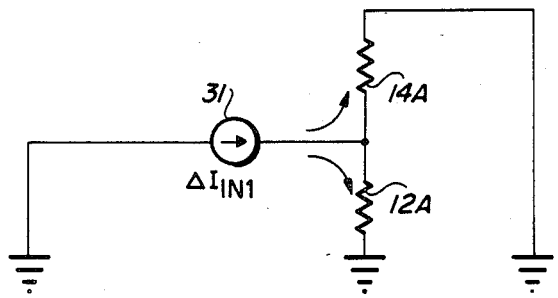
FIG. 2 is a small signal equivalent circuit representation of an input stage of the circuit of FIG. 1 and is helpful in understanding the operation of the circuit of FIG. 1.

To understand how the incremental current $\Delta I_{IN1}$ is split, it would be helpful to refer to the AC equivalent circuit of FIG. 2, wherein current source 31 represents $\Delta I_{IN1}$. Resistor 14A designates the emitter resistance $r_e$ of transistor 14 and resistor 12A designates the forward resistance of diode 12A. Since each of these resistances is 52 ohms, it can be seen that the incremental current $\Delta I_{IN1}$ is split equally into the emitter of transistor 14 and the anode of diode 12. (The base current of transistor 10 is negligible.)

Assuming that the emitter areas of diode 12 and transistor 10 are equal, diode 12 functions as a current mirror control transistor, and transistor 10 functions as a current mirror output transistor. Similarly, diode 13 functions as a control transistor of another current mirror and transistor 11 functions as the output transistor of that current mirror. If the emitter areas of transistors 10, 11, 14, and 15 and the emitter areas of diode-connected transistors 12 and 13 all are equal, then it can be assumed that the input current $\Delta I_{IN1}$ decreases $I_1$ by one half of the input current $\Delta I_{IN1}$ and increases the current $I_{D1}$ by one half of $\Delta I_{IN1}$. This produces a corresponding increase of $\Delta I_{IN1}/2$ in $I_3$.

For a differential input current, $\Delta I_{IN2}$ is of the same amplitude but opposite polarity of $\Delta I_{IN1}$. Since transistor 11 and diode 13 also act as a current mirror, the current $\Delta I_{IN2}$ flowing out of the anode of diode 13 results in a decrease in $I_4$ equal to one half of $\Delta I_{IN2}$, and an increase of one half of $\Delta I_{IN2}$ in $I_2$. The increase in $I_3$ plus the increase in $I_2$ causes a decrease in the voltage $V_2$ on conductor 4. The decrease of $I_1$ and $I_4$ causes an increase in $V_1$. The cross-coupled current mirror transistors 10 and 11 result in the linear transfer function for differential operation.

The following analysis of the operation of the circuit of FIG. 1 for differential input currents shows that the bias voltage $V_0$ on conductor 16 applied to the bases of transistors 14 and 15 is given by the equation $$V_0 = 2V_T \ln\left[\frac{\alpha I_0}{I_S}\right], \text{ where } \alpha = \frac{I_c}{I_E}. \tag{1}$$

Equation (1) simply represents the sum of the voltage drops across diodes 17 and 18. The same voltage $V_0$ appears across the base-emitter junction of transistor 14 and diode 12, as indicated by equation $$V_0 = V_T \ln\left[\frac{\alpha I_1}{I_S}\right] + V_T \ln\left[\frac{\alpha(I_1 + \Delta I_{IN1})}{I_S}\right]. \tag{2}$$

In equation (2), the first term represents the base to emitter voltage of transistor 14 and the second term represents the forward voltage drop across diode 12.

Equating the right-hand sides of equations (1) and (2) produces $$2V_T \ln\left[\frac{\alpha I_0}{I_S}\right] = V_T \ln\left[\frac{\alpha^2 I_1 (I_1 + \Delta I_{IN1})}{I_S^2}\right], \tag{3}$$

Squaring the argument of the left-hand sided equation (3) and equating it to the argument of the right-hand side thereof and collecting like terms results in the equation $$I_1^2 + I_1 \Delta I_{IN1} - I_0^2 = 0 \tag{4}$$

The quadratic equation solution of equation (4) leads to the equation $$I_1 = \frac{-\Delta I_{IN1} + \sqrt{\Delta I_{IN1}^2 + 4I_0^2}}{2}. \tag{5}$$

As explained above, transistor 10 acts as the output transistor of a current mirror having the sum of $I_1$ and $I_{IN1}$ as the control current. Therefore, the current $I_3$ is given by the equation $$I_3 = \alpha(I_1 + \Delta I_{IN1}). \tag{6}$$

Substituting equation (5) for $I_1$ leads to the equation $$I_3 = \frac{\alpha\left(\Delta I_{IN1} + \sqrt{\Delta I_{IN1}^2 + 4I_0^2}\right)}{2}. \tag{6.1}$$

Since the circuit of FIG. 1 is completely symmetrical, the equation for $I_2$ is the same as for $I_1$ except that $\Delta I_{IN2}$ is substituted for $\Delta I_{IN1}$. This leads to the equation $$I_2 = \frac{-\Delta I_{IN2} + \sqrt{\Delta I_{IN2}^2 + 4I_0^2}}{2}. \tag{7}$$

Again, by symmetry, the equation for $I_4$ is the same as for $I_3$, except that $\Delta I_{IN2}$ is substituted for $\Delta I_{IN1}$, resulting in the equation $$I_4 = \frac{\alpha\left(\Delta I_{IN2} + \sqrt{\Delta I_{IN2}^2 + 4I_0^2}\right)}{2}. \tag{8}$$

The voltage $V_1$ is simply $V_{CC}$ minus R multiplied by the sum of the current flowing through the collector of transistor 14 and $I_4$. Since the collector current of transistor 14 is $I_1$, the expression for $V_1$ is given by the equation $$V_1 = V_{CC} - (\alpha I_1 + I_4)R. \tag{9}$$

Similarly, the expression for $V_2$ is the same as for $V_1$ except that $I_2$ is substituted for $I_1$ and $I_3$ is substituted for $I_4$, leading to the equation $$V_2 = V_{CC} - (\alpha I_2 + I_3)R. \tag{10}$$

The differential gain of the circuit in FIG. 1 is defined by the equation $$R_{DIFF} = \frac{V_1 - V_2}{\Delta I_{IN1} - \Delta I_{IN2}}. \tag{11}$$

Substituting equations (9) and (10) into (11) leads to the equation $$R_{DIFF} = \frac{R(\alpha I_2 - \alpha I_1 + I_3 - I_4)}{\Delta I_{IN1} - \Delta I_{IN2}}. \tag{12}$$

Then, substituting equation (5) for $I_1$, and equation (7) for $I_2$, equation (6.1) for $I_3$, and equation (8) for $I_4$ leads to the equation $$R_{DIFF} = \alpha R. \tag{13}$$

Figure 4A:
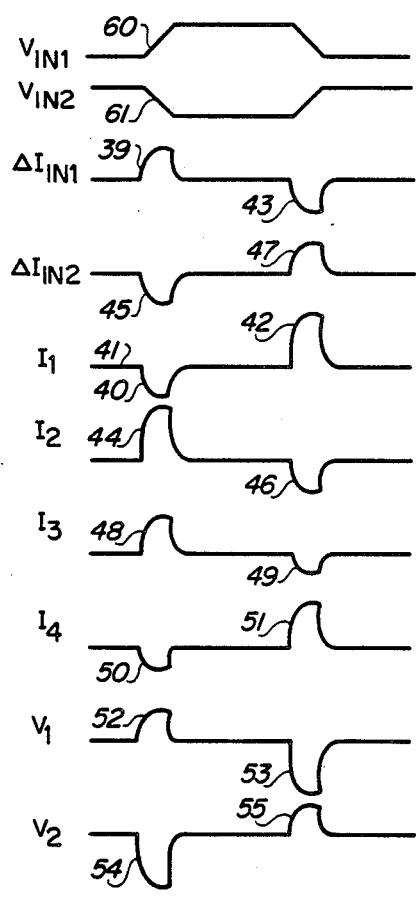
FIGS. 4A and 4B are timing diagrams illustrating waveforms that are useful in explaining the operation of the circuit of FIG. 1.

FIG. 4A shows the waveforms of $V_{IN1}$, $V_{IN2}$, $\Delta I_{IN1}$, $\Delta I_{IN2}$, $I_1$, $I_2$, $I_3$, $I_4$, $V_1$, and $V_2$ for the circuit of FIG. 1. In FIG. 4A, a differential input voltage $V_{IN1}$ minus $V_{IN2}$ is produced by the illustrated $V_{IN1}$ and $V_{IN2}$ waveforms, producing a six volt differential pulse between terminals 27 and 28. The resulting current pulses flowing through isolation capacitors 25 and 26 are shown by the $\Delta I_{IN1}$ and $\Delta I_{IN2}$ waveforms, wherein each rising edge of $V_{IN1}$ or $V_{IN2}$ produces a 0.5 milliampere pulse six nanoseconds in duration and each negative edge of $V_{IN1}$ or $V_{IN2}$ produces a negative 0.5 milliampere pulse of six nanoseconds duration.

The $I_1$ waveform shows a negative current pulse 40 extending down to a level of 0.3 milliamperes from a intermediate level 41 of 0.5 milliamperes. The second $\Delta I_{IN1}$ pulse 43 produces a positive going current pulse 42, and the $I_1$ waveform goes from 0.5 milliamperes to 0.8 milliamperes. The difference in amplitudes of pulses 40 and 42 is due to the nonlinear properties of transistors 10 and 14 and diode-connected transistor 12.

Similarly, the $I_2$ waveform in FIG. 4A shows a positive going current pulse 44 produced in response to the current pulse 45 of the $\Delta I_{IN2}$ waveform. Current pulse 44 is greater in amplitude than the negative going pulse 46 produced in response to the $\Delta I_{IN2}$ current pulse 47.

The resulting waveforms for $I_3$ and $I_4$ include pulses that are opposite but not equal. Pulse 48 of $I_3$ goes from 0.5 milliamperes to 0.8 milliamperes and pulse 49 goes from 0.5 milliamperes down to 0.3 milliamperes. Current pulse 50 of $I_4$ goes from 0.5 milliamperes down to 0.3 milliamperes and pulse 51 rises up to 0.8 milliamperes. Pulse 52 of $V_1$ rises from $V_{CC}$ minus 1 volt to $V_{CC}$ minus 0.6 volts (where $V_{CC}$ is equal to +5.0 volts and R is equal to 1000 ohms). Pulse 53 of $V_1$ goes from $V_{CC}$ minus 1.0 volts down to $V_{CC}$ minus 1.6 volts. Pulse 54 of $V_2$ goes from $V_{CC}$ minus 1.0 volts down to $V_{CC}$ minus 1.6 volts, and pulse 55 goes from $V_{CC}$ minus 1.0 volts up to $V_{CC}$ minus 0.6 volts.

The differential output voltage is $V_1$ minus $V_2$, and is equal to +1.0 volts for pulses 52 and 54 and is equal to −1.0 volts for pulses 53 and 55. Thus, the differential output voltage pulses are equal and opposite despite the fact that the various internal currents are not equal and opposite.

Figure 4B:
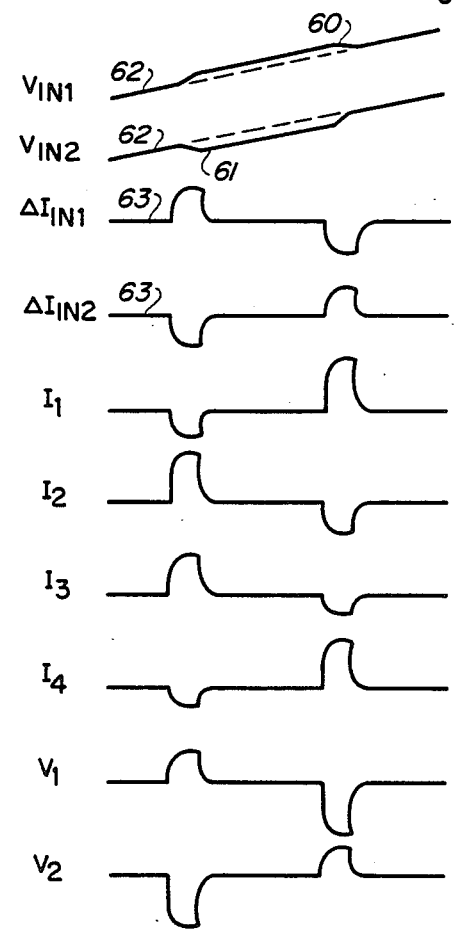

FIG. 4B shows waveforms for the same voltages and currents as FIG. 4A, except that the differential 3 volt signals for $V_{IN1}$ and $V_{IN2}$ in FIG. 4A are shown superimposed on a common mode transient input voltage having a rise time of 500 volts per microsecond. More specifically, in FIG. 4B the 3 volt $V_{IN1}$ pulse 60 is superimposed on the rising common mode 500 volt per microsecond transient voltage 62, and the minus 3 volt $V_{IN2}$ pulse 61 also is superimposed on the transient common mode input voltage 62. The $\Delta I_{IN1}$ and $\Delta I_{IN2}$ waveforms are similar to those in FIG. 4A, except the current pulses $\Delta I_{IN1}$ and $\Delta I_{IN2}$ both are superimposed on a 0.5 milliampere level designated by reference numeral 63.

The resulting negative $I_1$ pulse goes from 0.3 milliamperes to 0.2 milliamperes and the positive $I_1$ pulse goes from 0.3 milliamperes to 0.5 milliamperes. The $I_1$ pulses are lower in amplitude for FIG. 4B than for FIG. 4A because the common mode current of 0.5 milliamperes decreases the input impedance re of the current sense amplifier which reduces the $I_1$ pulses in FIG. 4B compared to FIG. 4A. Similarly, the positive $I_2$ pulse goes from 0.3 milliamperes to 0.5 milliamperes and the negative $I_2$ pulse goes from 0.3 milliamperes to 0.2 milliamperes. The upper, intermediate, and lower values of the $I_3$ waveform are 1.2, 0.8 and 0.5 milliamperes, respectively. The upper, intermediate, and lower values of the $I_4$ waveform are the same. The $V_1$ and $V_2$ waveforms are shifted downward 0.1 volts from the levels shown in FIG. 4A, but the differential output voltage $V_1$ minus $V_2$ is identical for FIGS. 4A and 4B, despite the fact that in FIG. 4B the differential input voltages are superimposed on the 500 volt per microsecond rising common mode transient voltage 62.

Thus, the gain for small signal operation of current sense amplifier 1 is equal to $\alpha R$ if resistors 22 and 23 each have a resistance of R. This linearity is rather surprising, considering the very nonlinear nature of resistors 12 and 13.

To better understand the internal operation of current sense amplifier 1 in response to a large common mode current in input conductors 2 and 3, assume that a large value of $\Delta I_{IN1}$ and an equal value of $\Delta I_{IN2}$ each equal to $\Delta I_{IN}$(common mode) flows in conductors 2 and 3. Since the circuit is symmetrical with respect to the input conductors 2 and 3, V1 and V2 both will change in the same direction and by the same magnitude. As long as the circuit is designed so that the common mode input current $\Delta I_{IN}$(common mode) does not drive any of the transistors into their saturation regions, the equivalent circuit of FIG. 2 accurately represents the circuit of transistors 12 and 14, and a similar circuit represents transistor 15 and diode 13. V1 tends to increase by a certain amount, but not nearly by the product of the $\Delta I_{IN}$(common mode) and R1, since the forward resistance of diode 12 is inversely proportional to $\Delta I_{IN}$(common mode).

The common mode gain of the circuit of FIG. 1 is defined by the equation $$R_{COM\,MODE} = \frac{V_{CC} - 2I_0R - V_1}{\Delta I_{IN}(\text{common mode})} \quad (14)$$

where $\Delta I_{IN}$(common mode)$=I_{IN1}=I_{IN2}$.

In this case, since the circuitry is completely symmetrical in FIG. 1, $V_1$ and $V_2$ both have equal values, so it is necessary only to set up equation (14) with reference to one of the output voltages, for example $V_1$. The numerator of equation (14) represents the difference between 1) the value of $V_1$ when $I_{IN1}$ and $\Delta I_{IN2}$ are equal to 0 and 2) the value of $V_1$ when $I_{IN1}$ and $\Delta I_{IN2}$ are both equal to $\Delta I_{IN}$(common mode). Substituting equation (9) for $V_1$ leads to the equation $$R_{COM\,MODE} = \frac{-2I_0R + \alpha I_1R + I_4R}{\Delta I_{IN}(\text{common mode})} \quad (15)$$

Substituting equations (5) and (8) for $I_1$ and $I_4$, respectively, leads to the equation $$R_{COM\,MODE} = \frac{-2I_0R + \alpha \sqrt{\Delta I_{IN1}^2 + 4I_0^2}}{\Delta I_{IN}(\text{common mode})}, \quad (16)$$

where $\Delta I_{IN1} = \Delta I_{IN2} = \Delta I_{IN}$(common mode).

The common mode rejection ratio can be defined by the equation $$CMRR = \frac{R_{DIFF}}{R_{COM\,MODE}} \quad (17)$$

FIG. 4B shows the waveforms of FIG. 4A for common mode inputs to the current sense amplifier of FIG. 1.

By inserting different values of $\Delta I_{IN1}$ as a percentage of $I_0$ into equation (17), it can be seen that CMRR has high values, exceeding 40 for $\Delta I_{IN}$(common mode) of less than $0.1I_0$.

FIG. 5 shows the simulated CMRR (common mode rejection ratio) for the circuit of FIG. 1 as a function of the ratio between $\Delta I_{IN1}$ and $I_0$. The CMRR is seen to be quite high for low common mode input currents.

It is thought to be quite surprising that the circuit of FIG. 1 has both linear differential voltage-to-current gain and also has substantial common mode rejection.

The differential gain of the circuit of FIG. 1 can be adjusted either by altering the value of the resistance R or by adjusting the emitter area ratios of the various transistors and diode coupled transistors. For example, using emitter areas for diodes 12 and 13 that are twice the emitter areas of transistors 10 and 11 results in an overall circuit gain of R/2. In this case, the quiescent current through transistors 10 and 11 is $I_0/2$, so that transient common mode input currents cause less disturbance to bias conductor 16, which has a low 52 ohm impedance to ground.

The above described current sense amplifier has an input impedance equal to that of a forward-biased base-emitter junction. The impedance decreases as the amplitude of the common mode current increases, either when the common mode current is flowing into the input terminals 2 and 3 or when it is flowing out of the input terminals 2 and 3. If the common mode current is flowing into terminals 2 and 3, the impedance of diodes 12 and 13 decreases, since the current through those diodes is increasing. If the common mode current is flowing out of terminals 2 and 3, the current through the emitter-base junction of transistors 14 and 15 increases, reducing the emitter impedances of those transistors.

Another advantage of the circuit o FIG. 1 is that stray capacitance at the input conductors 2 and 3 does not shunt away the current signal, because the capacitive impedence is large compared to the low parallel emitter resistance of transistor 14 and forward resistance of diode 12. The bandwidth is expected to be approximately that of $\alpha$ (i.e. greater than 10 megahertz) for small values of R. For larger values of R, the bandwidth will be limited by the pole formed by R and the capacitance at the output nodes.

It should be noted that the foregoing analysis for common mode input currents and differential input currents applies equally well to DC currents as to the incremental currents $\Delta I_{IN1}$ and $\Delta I_{IN2}$ described above. In some applications the isolation barrier capacitors 25 and 26 can be replaced by resistors, optical couplers, or any other current carrying components.

Figure 3:
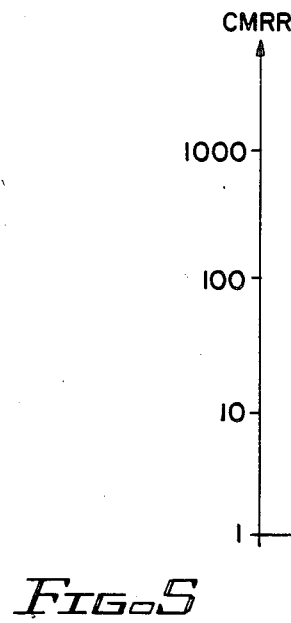
FIG. 3 is a schematic diagram of an embodiment similar to that of FIG. 1 except that field effect transistors are used instead f bipolar transistors.
Figure 3:
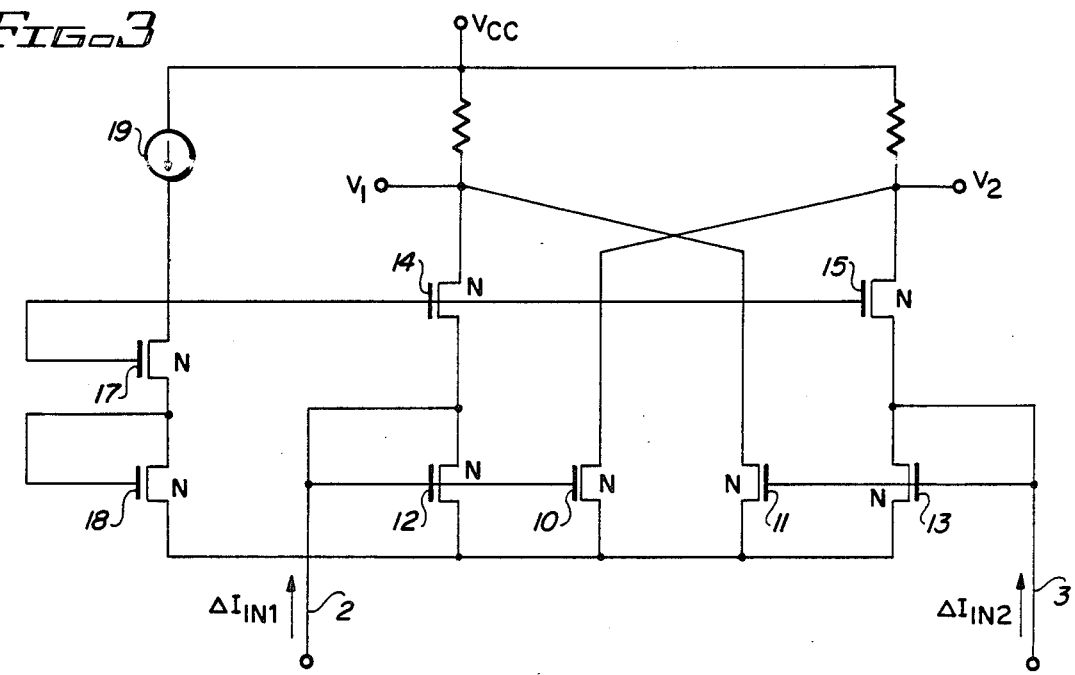

While the invention has been described with reference to a particular embodiment thereof, those skilled in the art will be able to make various modifications to the described embodiments without departing from the true spirit and scope of the invention. For example, the NPN transistors 10, 11, 12, 13, 14, 15, 17, and 18 of FIG. 1 could be replaced by MOS field effect transistors, as shown in FIG. 3, and the above described operation and benefits would be achieved.

What is claimed is:

1. A current sense amplifier having first and second input terminals and first and second output terminals, comprising in combination:
   (a) a bias voltage circuit for producing a bias voltage;
   (b) a first transistor having a base connected to receive the bias voltage, a collector coupled to the first output terminal, and an emitter coupled to the first input terminal;
   (c) a second transistor having a base connected to receive the bias voltage, a collector coupled to the second output terminal, and an emitter coupled to the second input terminal;

(d) first and second load devices coupled to the collectors of the first and second transistors, respectively;

(e) a first current mirror having a control terminal for receiving a first input current from the first input terminal and an output terminal coupled to the second output terminal;

(f) a second current mirror having a control terminal for receiving a second input current from the second input terminal and an output terminal coupled to the first output terminal.

2. The current sense amplifier of claim 1 wherein the first and second transistors are bipolar transistors, and wherein the first current mirror includes a control transistor coupled between the first input terminal and a first reference voltage conductor and an output transistor having a base electrode connected to the first input terminal, an emitter connected to the first reference voltage conductor, and a collector coupled to the second output terminal, and wherein the second current mirror includes a control transistor coupled to the second input terminal and an output transistor having an emitter coupled to the first reference voltage conductor, a base connected to the second input terminal, and a collector coupled to the first output terminal.

3. The current sense amplifier of claim 2 wherein the bias voltage circuit includes a current source connected to a first terminal, a first diode having its anode connected to the first terminal and a cathode connected to the anode of a second diode the second diode having a cathode connected to the first reference voltage conductor.

4. The current sense amplifier of claim 3 wherein the first and second load devices include resistors coupled between a second voltage reference conductor and the first and second output terminals, respectively.

5. The current sense amplifier of claim 4 including first and second capacitors connected in series with the first and second input terminals, respectively.

6. The current sense amplifier of claim 3 including first and second isolation capacitors connected to the first and second input terminals, respectively, the first and second input currents being incremental currents flowing through the first and second isolation capacitors, respectively.

7. The current sense amplifier of claim 6 wherein the first and second isolation capacitors each have a capacitance of approximately 1 picofarad.

8. The current sense amplifier of claim 3 wherein the first and second transistors are NPN transistors and the output transistors of the first and second current mirrors are NPN transistors.

9. The current sense amplifier of claim 8 wherein the first and second diodes are diode-connected NPN transistors and the control transistors of the first and second current mirrors are NPN transistors.

10. A current sense amplifier comprising in combination:

(a) first and second transistors;

(b) first and second current mirror circuits having output conductors cross-coupled to collectors of the first and second transistors, respectively;

(c) means for applying a bias voltage to bases of the first and second transistors;

(d) first and second load devices connected to the collectors of the first and second transistors, respectively;

(e) means for coupling emitters of the first and second transistors to control inputs of the second and first current mirror circuits, respectively.

11. A method of obtaining low input impedance, high differential gain linearity, and a common mode rejection ratio greater than one, comprising the steps of:

(a) applying a bias voltage to bases of first and second transistors;

(b) forcing first and second input currents into control inputs of first and second current mirror circuits, there being a difference in values of the first and second input currents;

(c) conducting first and second currents from emitters of the first and second transistors into the control inputs of the first and second current mirrors, respectively;

(d) producing third and fourth currents in outputs of the first and second current mirror circuits, respectively;

(e) conducting the first current and the fourth current through a first load device to produce a first output voltage, and conducting the second current and the third current through a second load device to produce a second output voltage.

12. The method of claim 11 wherein step (a) includes producing the bias voltage by forcing a bias current through a number of series-connected PN junctions equal to a number of PN junctions through which the first current flows as it flows through the first transistor and the first current mirror circuit.

13. The method of claim 11 wherein the first and second input currents are equal and opposite incremental input currents, the method including forcing the first and second input currents to flow through first and second isolation capacitors into the control inputs of the first and second current mirror circuits, respectively.

* * * * *